United States Patent
Li (10) Patent No.: US 11,619,672 B2
(45) Date of Patent: Apr. 4, 2023

(54) STATE ESTIMATION METHOD AND A BATTERY PACK

(71) Applicant: SIMPLO TECHNOLOGY CO., LTD., Hsinchu County (TW)

(72) Inventor: Je-Feng Li, Hsinchu County (TW)

(73) Assignee: SIMPLO TECHNOLOGY CO., LTD., Hsinchu County (TW)

( * ) Notice: Subject to any disclaimer, the term of this patent is extended or adjusted under 35 U.S.C. 154(b) by 0 days.

(21) Appl. No.: 17/398,657

(22) Filed: Aug. 10, 2021

(65) Prior Publication Data
US 2022/0299570 A1 Sep. 22, 2022

(30) Foreign Application Priority Data
Mar. 22, 2021 (TW) ................. 110110182

(51) Int. Cl.
*G01R 31/36* (2020.01)
*G01R 31/3835* (2019.01)
*G01R 31/392* (2019.01)

(52) U.S. Cl.
CPC ..... *G01R 31/3648* (2013.01); *G01R 31/3835* (2019.01); *G01R 31/392* (2019.01)

(58) Field of Classification Search
CPC ............ G01R 31/3648; G01R 31/3835; G01R 31/392
See application file for complete search history.

(56) References Cited

U.S. PATENT DOCUMENTS

| 6,411,911 B1* | 6/2002 | Hirsch | G01R 31/367 |
| | | | 702/182 |
| 2010/0090650 A1* | 4/2010 | Yazami | H01M 10/443 |
| | | | 324/426 |
| 2016/0039419 A1* | 2/2016 | Wampler | G01R 31/367 |
| | | | 701/22 |

(Continued)

FOREIGN PATENT DOCUMENTS

CN 108459272 A 8/2018

*Primary Examiner* — Ricky Go
(74) *Attorney, Agent, or Firm* — Muncy, Geissler, Olds & Lowe, P.C.

(57) ABSTRACT

This disclosure provides a state estimation method and a battery pack. The method includes: obtaining aging factor data, predetermined discharge data and predetermined capacity loss changing data; recording measured discharge data of a to-be-measured battery; calculating to obtain discharge voltage difference data according to the predetermined discharge data and the measured discharge data; determining a specific interval Sa according to the discharge voltage difference data, and obtaining a voltage difference statistical value $\Delta V_{2,Stats}$ in the specific interval Sa; calculating an estimation capacity loss $\Delta Q_D$ of the to-be-measured battery according to the aging factor data and the voltage difference statistical value $\Delta V_{2,Stats}$; and determining whether the to-be-measured battery is abnormal or not according to the predetermined capacity loss changing data and the estimation capacity loss $\Delta Q_D$.

13 Claims, 10 Drawing Sheets

(56) References Cited

U.S. PATENT DOCUMENTS

| | | | |
|---|---|---|---|
| 2016/0187428 A1* | 6/2016 | Basu | G01R 31/367 |
| | | | 702/63 |
| 2017/0115355 A1* | 4/2017 | Willard | G01R 31/3648 |
| 2020/0132777 A1* | 4/2020 | K | G01R 31/3648 |

* cited by examiner

FIG. 1

```
┌─────────────────────────────────────────────┐
│ Two discharge curves V₁ and V₂ under        │──S02
│ different aging states are obtained.        │
└─────────────────────────────────────────────┘
                      ↓
┌─────────────────────────────────────────────┐
│ The capacity loss △Q₁ is calculated         │
│ according to full discharge capacities      │──S04
│ FDC1 and FDC2 of the discharge curves       │
│ V₁ and V₂.                                  │
└─────────────────────────────────────────────┘
                      ↓
┌─────────────────────────────────────────────┐
│ The discharge curves are subtracted from    │
│ each other to obtain the discharge voltage  │──S06
│ difference curve V₁₂ of the voltage         │
│ difference versus the capacity.             │
└─────────────────────────────────────────────┘
                      ↓
┌─────────────────────────────────────────────┐
│ A first statistical value △V₁,Stats of the  │
│ voltage difference in the specific interval │──S08
│ Sa is calculated.                           │
└─────────────────────────────────────────────┘
                      ↓
┌─────────────────────────────────────────────┐
│ The calculation is made according to the    │
│ capacity loss △Q1 and the first statistical │──S10
│ value △V₁,Stats to obtain the aging         │
│ factor β.                                   │
└─────────────────────────────────────────────┘
```

STATE ESTIMATION METHOD AND A BATTERY PACK

CROSS-REFERENCE TO RELATED APPLICATIONS

This application claims priority of No. 110110182 filed in Taiwan R.O.C. on 2021 Mar. 22 under 35 USC 119, the entire content of which is hereby incorporated by reference.

BACKGROUND OF THE INVENTION

Field of the Invention

This disclosure relates to a state estimation method and a battery pack, and more particularly to a state estimation method and a battery pack capable of detecting an abnormal condition.

Description of the Related Art

Recently, Li-ion batteries have been widely applied to many mobile devices, such as mobile phones, tablets, notebook computers and the like. Because the environmental awareness gradually increases, many countries have set a time limit for the ban on the sale of fuel vehicles and motorcycles. This will increase the popularization of the future electric vehicles and motorcycles. In order to ensure a certain endurance of each of the electric vehicles and motorcycles, the high capacity battery is required. Therefore, the required number of batteries constantly increases, so the battery plays a key role in the device.

When the battery is being used, the battery may become abnormal due to the improper operation and environment condition and the manufacturing problem itself. For example, the battery may have the accelerated aging phenomenon, the inner structure change, and the detachment and metal depositing problems. When these conditions occur, the minor condition may be the voltage loss and the capacity loss, and the most serious condition may be the triggered safety problem of the battery. So, how to detect the abnormal battery in a real-time manner is a very important issue.

China Patent Publication No. CN108459272A discloses a state estimation device of a battery pack capable of estimating a state of the battery pack having electric energy storage elements. The state estimation device firstly obtains a low change region, in which the change of the OCV of the electric energy storage element relative to the remaining capacity is small, and a high change region, in which the change of the OCR relative to the remaining capacity is higher than that of the low change region, and then estimates the state of the battery pack based on the change position of the high change region of the electric energy storage element relative to the actual capacity.

Another existing method is to perform the judgement by detecting the change rate of the internal resistance of the battery with the elapse of time. However, such the method needs some additional operations to calculate the internal resistance. For example, a load needs to be added in a short period of time so that the calculation can be made according to the voltage difference and the current. Furthermore, such the method only can calculate the internal resistance of the battery at a time instant, and another operation is required if the internal resistance at another time instant needs to be calculated. The change rate of the resistance with time needs to be calculated according to the resistance values measured at two time instants, and the time interval between the two time instants cannot be too long, so that the differential change rate can be obtained by the differential and approaching calculation. Therefore, using this method to detect whether the battery is detached in the actual battery application will interrupt the original operation condition of the user and even need the extremely short measurement interval.

BRIEF SUMMARY OF THE INVENTION

An objective of an embodiment of this disclosure is to provide a state estimation method capable of judging whether a to-be-measured battery becomes abnormal. An objective of another embodiment of this disclosure is to provide a state estimation method capable of detecting the abnormal condition of the battery in a use process of the battery. An objective of still another embodiment of this disclosure is to provide a battery pack capable of executing the state estimation method.

According to an embodiment of this disclosure, a state estimation method is provided. The method includes steps of: obtaining predetermined data from a storage unit, wherein the predetermined data includes aging factor data, predetermined discharge data, and predetermined capacity loss changing data; recording measured discharge data of a to-be-measured battery; calculating to obtain discharge voltage difference data according to the predetermined discharge data and the measured discharge data; determining a specific interval Sa according to the discharge voltage difference data, and obtaining a voltage difference statistical value $\Delta V_{2,Stats}$ in the specific interval Sa; calculating an estimation capacity loss $\Delta Q_D$ of the to-be-measured battery according to the aging factor data and the voltage difference statistical value $\Delta V_{2,Stats}$; and determining whether the to-be-measured battery is abnormal or not according to the predetermined capacity loss changing data and the estimation capacity loss $\Delta Q_D$.

In one embodiment, the predetermined discharge data is a discharge curve $V_1$, the discharge curve $V_1$ is a voltage-capacity curve. The measured discharge data of the to-be-measured battery is a discharge curve $V_4$, and the discharge curve $V_4$ is a voltage-capacity curve. The discharge voltage difference data is a discharge voltage difference curve $V_{14}$ determined according to the discharge curve $V_1$ and a discharge curve $V_3$. In addition, the voltage difference statistical value $\Delta V_{2,Stats}$ is determined according to a voltage difference between the discharge curve $V_1$ and the discharge curve $V_4$ in the specific interval.

In one embodiment, the step of determining a specific interval Sa according to the discharge voltage difference data includes: dividing the discharge voltage difference curve $V_{14}$ into a tilted region and a flat region using a calculation method, and setting the specific interval Sa as the flat region.

In one embodiment, the calculation method includes steps of dividing the discharge voltage difference curve $V_{14}$ into multiple secants including a first secant and a second secant, wherein a slope of the first secant smaller than a first threshold value $TH_1$ represents beginning of the flat region, and a slope of the second secant greater than a second threshold value $TH_2$ represents ending of the flat region.

In one embodiment, the calculation method includes steps of: dividing the discharge voltage difference curve $V_{14}$ into multiple intervals and calculating multiple variances of the intervals including a first variance and a second variance, wherein the intervals include a first interval and a second interval, the variance of the first interval is the first variance, and the variance of the second interval is the second variance. The first variance smaller than a first threshold value $TH_3$ represents beginning of the flat region, and the second variance greater than a second threshold value $TH_4$ represents ending of the flat region.

In one embodiment, the predetermined capacity loss changing data is a predetermined capacity loss curve $\Delta CQ_P$. The predetermined data further includes: an upper bound curve $\Delta UQ_P$ and a lower-bound curve $\Delta LQ_P$ corresponding to the predetermined capacity loss curve $\Delta CQ_P$. The step of determining whether the to-be-measured battery is abnormal or not according to the predetermined capacity loss changing data includes: judging whether the estimation capacity loss $\Delta Q_D$ falls between the upper bound curve $\Delta UQ_P$ and the lower-bound curve $\Delta LQ_P$ corresponding to the predetermined capacity loss curve $\Delta CQ_P$; determining the to-be-measured battery as normal aging when the estimation capacity loss $\Delta Q_D$ falls between the upper bound curve $\Delta UQ_P$ and the lower-bound curve $\Delta LQ_P$ corresponding to the predetermined capacity loss curve $\Delta CQ_P$; and determining the to-be-measured battery as abnormal when the estimation capacity loss $\Delta Q_D$ does not fall between the upper bound curve $\Delta UQ_P$ and the lower-bound curve $\Delta LQ_P$ corresponding to the predetermined capacity loss curve $\Delta CQ_P$.

In one embodiment, the step of determining whether the to-be-measured battery is abnormal or not according to the predetermined capacity loss changing data further includes: obtaining a current cycle number Ncy, wherein a predetermined capacity loss $\Delta Q_P$ is obtained according to the predetermined capacity loss changing data and the cycle number Ncy; and comparing the estimation capacity loss $\Delta Q_D$ with the predetermined capacity loss $\Delta Q_P$, and judging whether the estimation capacity loss $\Delta Q_D$ falls between the upper bound curve $\Delta UQ_P$ and the lower-bound curve $\Delta LQ_P$ corresponding to the predetermined capacity loss curve $\Delta CQ_P$. In one embodiment, preferably, the upper bound curve $\Delta UQ_P$ is the predetermined capacity loss curve $\Delta CQ_P$ plus an upper limit $\gamma_1$, and the lower-bound curve $\Delta LQ_P$ is the predetermined capacity loss curve $\Delta CQ_P$ minus a lower limit $\gamma_2$. The step of comparing the estimation capacity loss $\Delta Q_D$ with the predetermined capacity loss $\Delta Q_P$ includes: judging whether $|\Delta Q_D - \Delta Q_P|$ exceeds the upper limit $\gamma_1$ or the lower limit $\gamma_2$.

In one embodiment, the aging factor data includes at least one aging factor $\beta$; and the estimation capacity loss $\Delta Q_D = \beta \times \Delta V_{2,Stats}$. In one embodiment, the at least one aging factor $\beta$ is determined according to a predetermined capacity loss $\Delta Q_1$ and a first statistical value $\Delta V_{1,Stats}$, and $\beta = \Delta Q_1 / \Delta V_{1,Stats}$, and the predetermined capacity loss $\Delta Q_1$ is determined according to the discharge curve $V_1$ and a discharge curve $V_2$; and the first statistical value $\Delta V_{1,Stats}$ is determined according to a specific interval Sa of a discharge voltage difference curve $V_{12}$ of the discharge curve $V_1$ and the discharge curve $V_2$.

In one embodiment, the voltage difference statistical value $\Delta V_{2,Stats}$ is a mean $\Delta V_{2,avg}$ of voltage differences in the specific interval Sa of the discharge voltage difference curve $V_{14}$ obtained from the discharge curve $V_1$ and the discharge curve $V_4$, and the first statistical value $\Delta V_{1,Stats}$ is a mean $V_{1,avg}$ of voltage differences in the specific interval Sa of the discharge voltage difference curve $V_{12}$ obtained from the discharge curve $V_1$ and the discharge curve $V_2$. In one embodiment, at least one of the upper limit $\gamma_1$ and the lower limit $\gamma_2$ is a constant or a variable value determined by a function.

In one embodiment, the state estimation method further includes: outputting a warning signal when the to-be-measured battery is determined as abnormal.

According to an embodiment of this disclosure, a battery pack is provided. The battery pack includes a battery and a control device. The control device electrically connected to the battery executes the state estimation method.

As mentioned hereinabove, the state estimation method according to an embodiment of this disclosure can measure the discharge voltage difference curve of the voltage difference versus the capacity, and then determine a specific interval Sa according to the discharge voltage difference curve, and then determine the capacity loss $\Delta Q_{D\_}$ of the to-be-measured battery according to the specific interval Sa and pre-established aging factor $\beta$, and finally judge whether the capacity loss $\Delta Q_{D\_}$ becomes abnormal to detect whether the battery has the abnormal condition. Thus, the abnormal condition of the battery can be detected in the use process of the battery.

DETAILED DESCRIPTION OF THE INVENTION

An embodiment of this disclosure provides a state estimation method capable of detecting whether a battery pack has an abnormal condition according to the steps of obtaining a specific interval Sa of a curve of a voltage difference versus a capacity, determining a capacity loss $\Delta Q_{D\_}$ according to a pre-established aging factor $\beta$ and the specific interval Sa, and finally judging whether the capacity loss $\Delta Q_{D\_}$ becomes abnormal.

Figure 1:
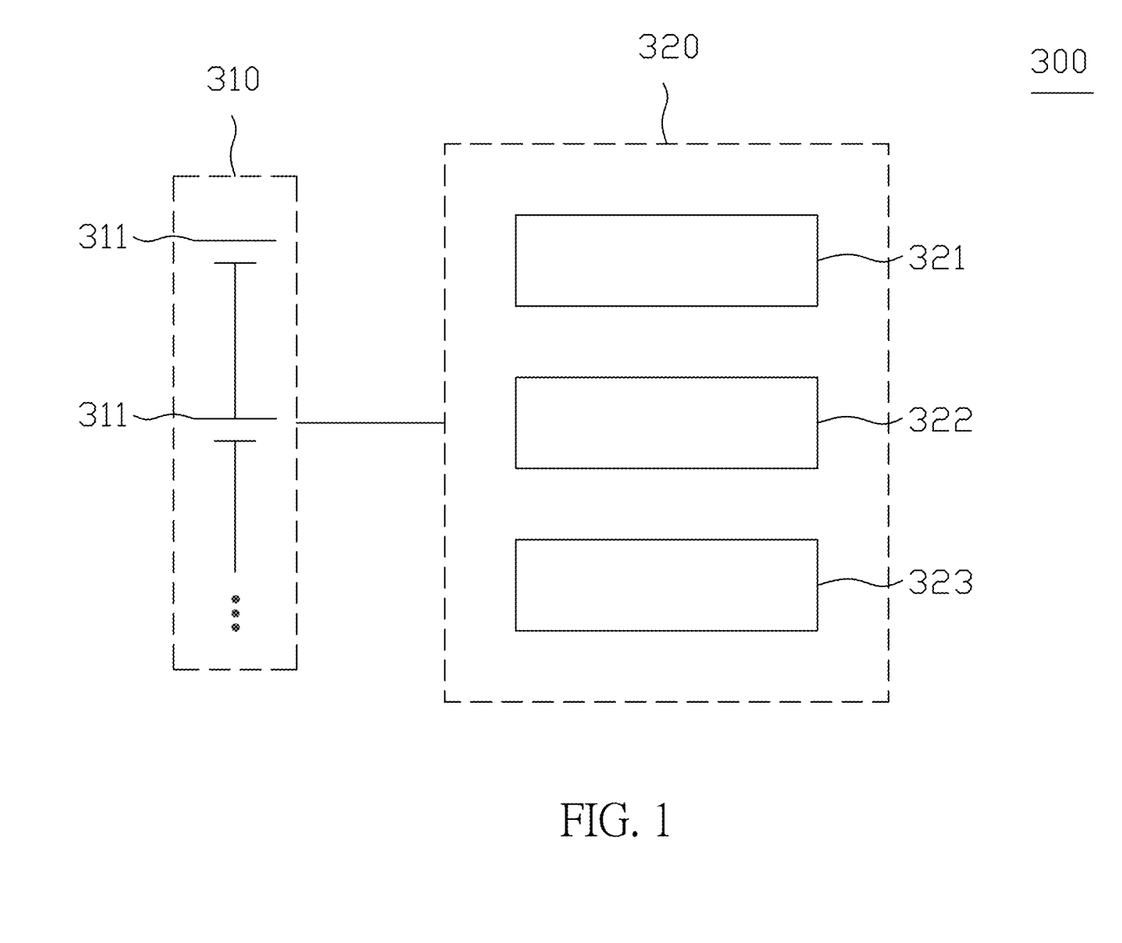
FIG. 1 is a functional block diagram showing a battery pack according to an embodiment of this disclosure.

FIG. 1 is a functional block diagram showing a battery pack according to an embodiment of this disclosure. The state estimation method is applicable to a battery pack 300. Referring to FIG. 1, the battery pack 300 includes a battery device 310 and a control device 320. The battery device 310 includes at least one battery 311. The control device 320 can execute the state estimation method, and includes a storage unit 321, a detection unit 322 and a processing unit 323. The storage unit 321 may be, for example, a memory for storing various kinds of predetermined data, such as a pre-obtained predetermined aging factor β, a predetermined discharge curve $V_1$, a predetermined capacity loss change and other detection data. The detection unit 322 connected to the battery 311 of the battery device 310 obtains battery information of the battery 311, such as the voltage and the like. The processing unit 323 obtains the data required by the state estimation method from the storage unit 321 and the detection unit 322, and detects whether the batteries 311 have abnormal phenomena. In addition, those skilled in the art can determine the structures of the battery device 310 and the control device 320 according to the description of this disclosure, the properties of the circuit elements for implementing this disclosure and/or the effects to be achieved for the implementation of this disclosure. Also, those skilled in the art may equivalently modify the implementation of this disclosure according to the disclosed contents. In the following, the state estimation method according to an embodiment of this disclosure will be explained in more detail.

Figure 2:
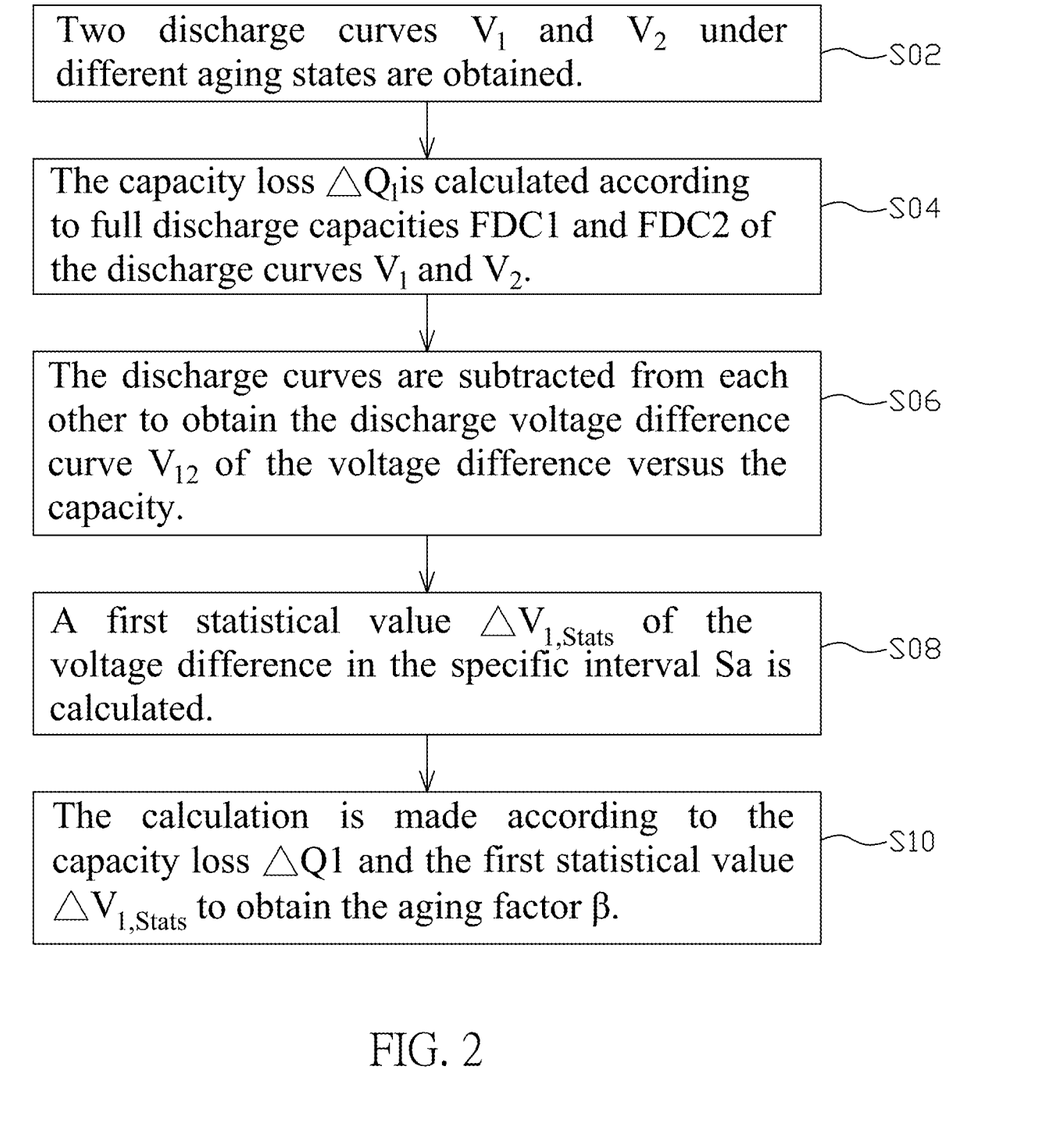
FIG. 2 is a flow chart showing determining of predetermined data of a state estimation method according to an embodiment of this disclosure.
Figure 3A:
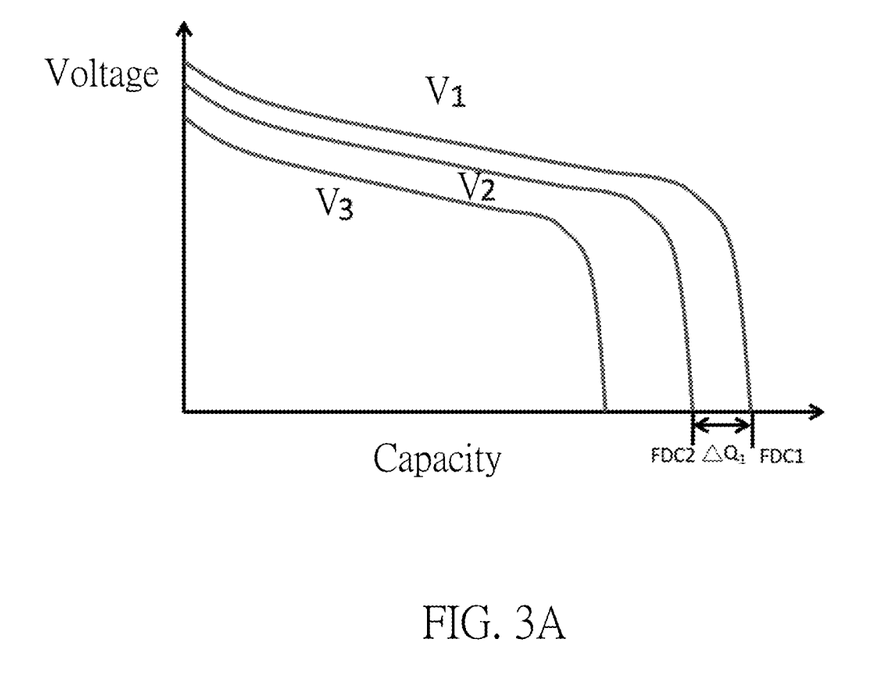
FIG. 3A shows multiple discharge curves of different cycle numbers according to an embodiment of this disclosure.
Figure 3B:
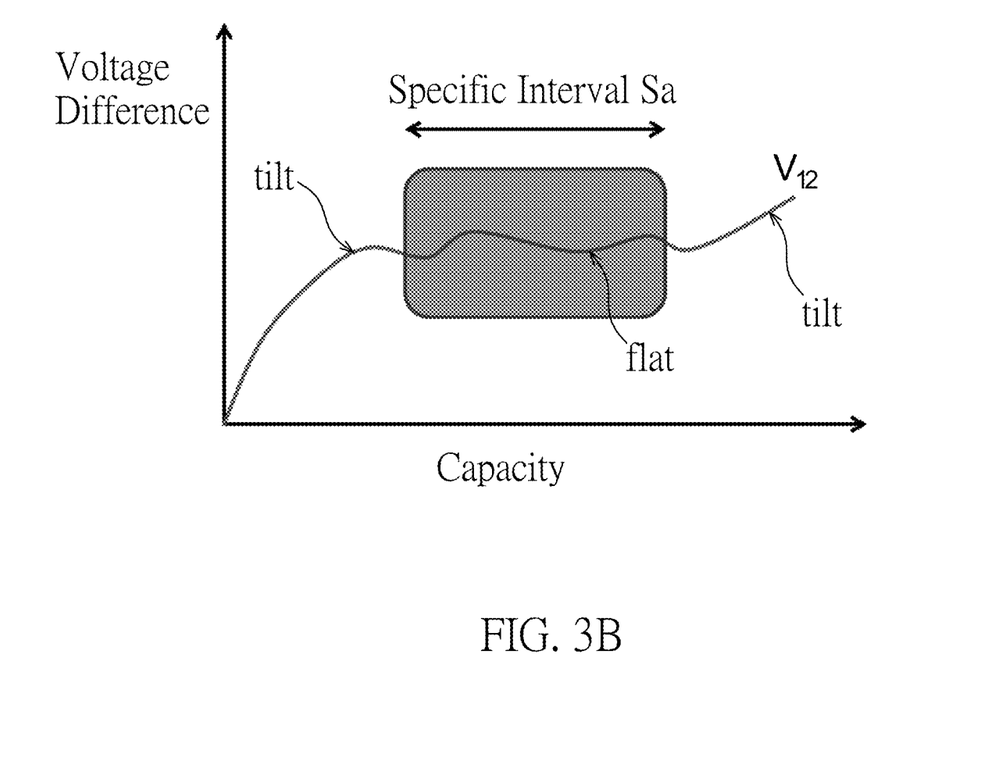
FIG. 3B shows a discharge voltage difference curve of the voltage difference versus the capacity according to an embodiment of this disclosure.

FIG. 2 is a flow chart showing the determining of predetermined data of the state estimation method according to an embodiment of this disclosure. FIG. 3A shows multiple discharge curves of different cycle numbers Ncy according to an embodiment of this disclosure. FIG. 3B shows a discharge voltage difference curve of the voltage difference versus the capacity according to an embodiment of this disclosure. Before the detection of the abnormal condition, the information for the detection of the abnormal condition needs to be established in advance. It is possible to perform the experiments of cycling aging of predetermined batteries in advance, and thus to obtain the battery discharge curve under different cycle numbers, and the aging factor β is determined according to the battery discharge curves. The following explanation will be made in detail. Referring to FIGS. 2 to 3B, the method of determining the predetermined data for the state estimation method according to an embodiment of this disclosure includes the following steps.

In a step S02, two discharge curves $V_1$ and $V_2$ under different aging states are obtained. As shown in FIG. 3B, $V_1$ denotes a discharge curve of a predetermined battery, wherein the predetermined battery is preferably a brand new battery; $V_2$ denotes a discharge curve of an aging battery; and $V_3$ denotes another discharge curve of the aging battery. Because the capacity loss increases as the discharge cycles increase, it is obtained that the cycle number Ncy (i.e., the discharge number of times) of the discharge curve $V_3$ is greater than the cycle number Ncy of the discharge curve $V_2$.

In a step S04, the capacity loss $\Delta Q_1$ is calculated according to full discharge capacities FDC1 and FDC2 of the discharge curves $V_1$ and $V_2$. In one embodiment, as shown in FIG. 3A, the full discharge capacity FDC1 of the predetermined battery minus the full discharge capacity FDC2 of the aging battery leaves the capacity loss $\Delta Q_1$.

In a step S06, the discharge curves are subtracted from each other to obtain the discharge voltage difference curve $V_{12}$ of the voltage difference versus the capacity. In one embodiment, the voltages of the discharge curves $V_1$ and $V_2$ at the same discharge capacity Q in FIG. 3A are subtracted from each other to obtain the voltage difference, and thus the discharge voltage difference curve $V_{12}$ (FIG. 3B) of the voltage difference versus the capacity can be thus obtained.

In a step S08, a specific interval Sa is determined. A first statistical value $\Delta V_{1,Stats}$ of the voltage difference in the specific interval Sa is calculated. In one embodiment, the first statistical value $\Delta V_{1,Stats}$ is a mean $\Delta V_{1,avg}$ of the voltage differences in the specific interval Sa. Preferably, as shown in FIG. 3B, the specific interval Sa is a flat region "flat" in the discharge voltage difference curve $V_{12}$. More specifically, the discharge voltage difference curve $V_{12}$ includes at least one tilted region "tilt" and a flat region "flat", wherein an integral slope of the flat region "flat" is smaller than an integral slope of the at least one tilted region "tilt". In particular, although the first statistical value is a mean $V_{1,avg}$ functioning as an illustrative example in this embodiment, the first statistical value may also be a median, a mode or any other statistical value of the voltage differences capable of serving as an indicator or a characteristic in the specific interval Sa, and this disclosure is not limited to the mean. In one embodiment, a calculation method may be executed to divide the discharge voltage difference curve $V_{12}$ into at least one tilted region "tilt" and a flat region "flat", wherein the calculation method can be properly configured according to requirements. For example, a statistical method can be executed to find out the distinguishing feature between the tilted region "tilt" and the flat region "flat", and the calculation method can be configured according to the distinguishing feature.

In a step S10, the calculation is made according to the capacity loss $\Delta Q_1$ and the first statistical value $\Delta V_{1,Stats}$ to obtain the aging factor β. In one embodiment, the first statistical value $\Delta V_{1,Stats}$ is a mean $\Delta V_{1,avg}$ and the mean $\Delta V_{1,avg}$ is divided by $\Delta Q_1$ to obtain the aging factor β of the discharge curve $V_2$. This disclosure is not limited to the mean, and may also execute the calculation according to the capacity loss $\Delta Q_1$ and the first statistical value $\Delta V_{1,Stats}$ to obtain the aging factor β. In one embodiment, the first statistical value $\Delta V_{1,Stats}$ is divided by $\Delta Q_1$ to obtain the aging factor β of the discharge curve $V_2$.

Figure 4A:
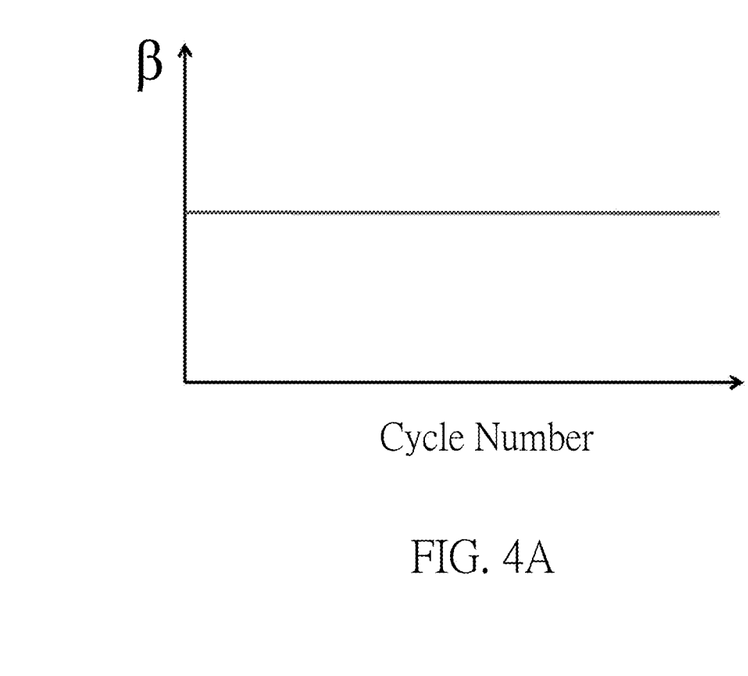
FIG. 4A is a graph showing a $\beta$ change versus different aging conditions according to an embodiment of this disclosure.

FIG. 4A is a graph showing a change of the aging factor β at different aging conditions according to an embodiment of this disclosure. In general, the main mechanism causing the aging of the battery pack is the growth of the SEI film. When the thickness of the SEI film is constantly increased, the electronic consumption is increased, and the capacity loss of the battery is increased, so that the energy loss is caused when the lithium ions move in or out, and that the voltage drop of the battery pack is increased. The voltage drop and the capacity loss of the battery are caused when the SEI film is growing, which is a linear growing relationship. The voltage drop divided by the capacity loss (i.e., $\Delta V/\Delta Q$) equal to a constant serving as the aging factor β is obtained. If a graph showing the constant versus the cycle number Ncy is made, the result of FIG. 4A can be obtained. As shown in FIG. 4A, the aging factor β does not change with the change of the cycle number Ncy. That is, the aging factor β is constant with respect to the cycle number Ncy.

Figure 4B:
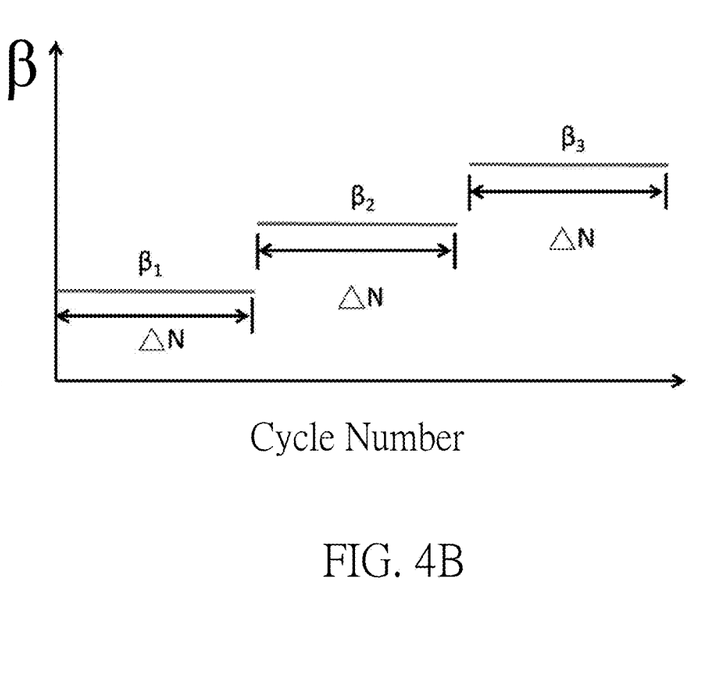
FIG. 4B is a graph showing a $\beta$ change versus different aging conditions according to another embodiment of this disclosure.

FIG. 4B is a graph showing a change of the aging factor β at different aging conditions according to another embodiment of this disclosure. In addition, in many aging conditions of battery packs, the change of the environment condition (e.g., the extremely high temperature, the extremely low temperature, or the battery pack operates under the extremely high current), the rapid capacity drop of the battery pack and the growth of the lithium metal additionally occur. These aging mechanisms affect the ratio of the voltage drop to the capacity loss and thus change the value of β. In one embodiment, in order to obtain the aging phenomenon in response to the conditions, the aging factor β is configured to change with the change of the cycle number Ncy. As shown in the early aging period of FIG. 4B, the aging mechanism is dominated by the SEI film, so the ratio of β1 can be calculated. After several cycles have been added, the influence of other aging mechanisms changes the ratio of the voltage drop to the capacity loss, so that the ratio becomes β2 or β3.

As mentioned hereinabove, the change of the aging factor β where the aging mechanism is dominated by the SEI film is shown in FIG. 4A. In this case, only one value of the aging factor β is needed. In the condition where the aging mechanism is not simply dominated by the SEI film, the change of the value of the aging factor β is shown in FIG. 4B. In this case, a table showing the change of the value of the aging factor β with the change of the cycle number Ncy can be established. As mentioned hereinabove, the aging factor data may be configured as a constant aging factor β, or as including multiple aging factors β2 or β3 according to different types of products. Those skilled in the art can make a decision for the aging factor data according to different types of products.

Figure 5:
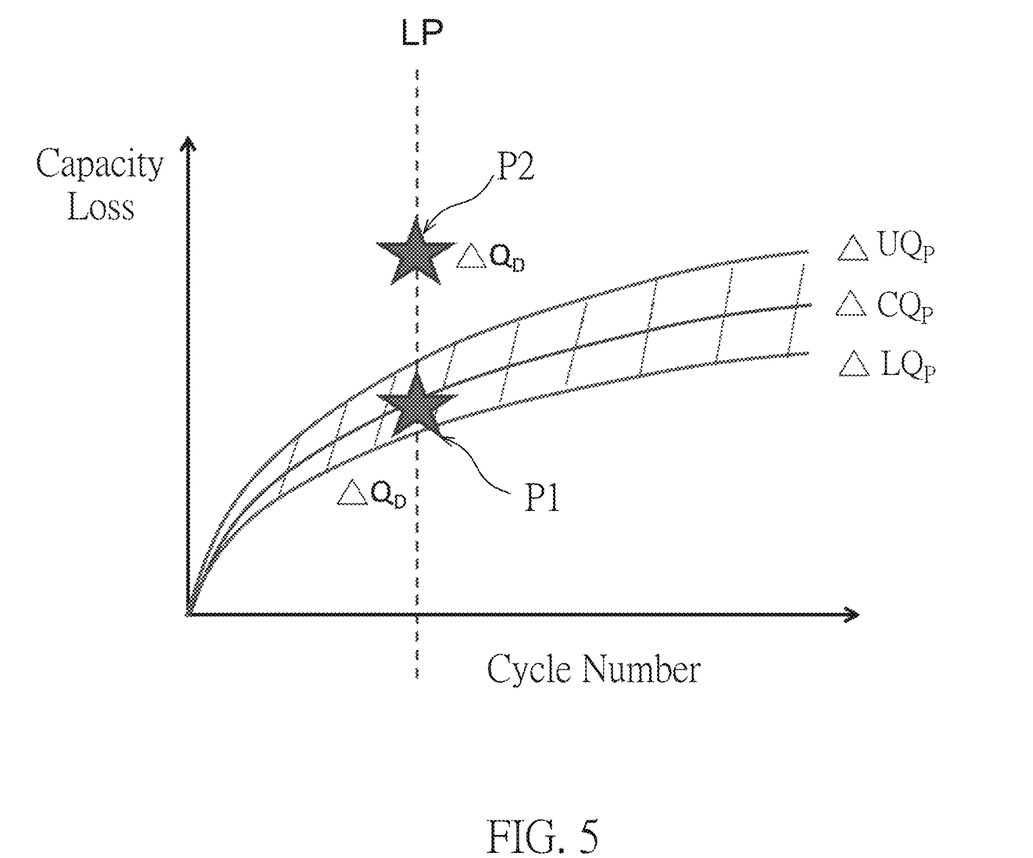
FIG. 5 shows curves of the cycle number versus the capacity loss.

FIG. 5 shows a predetermined capacity loss curve of the cycle number versus the capacity loss obtained by experiment; and an upper bound curve and a lower-bound curve corresponding to the predetermined capacity loss curve. Referring to FIG. 5, the full discharge capacity change obtained by the previous aging experiment is adopted to obtain the predetermined capacity loss curve $\Delta CQ_P$. Specifically, the full discharge capacity of the predetermined battery 311 minus the full discharge capacities of the aging battery ar different cycle numbers Ncy, so that multiple sets of cycle numbers Ncy and their corresponding capacity losses can be obtained, then the predetermined capacity loss curve $\Delta CQ_P$ can be determined. Finally, the upper bound curve $\Delta UQ_P$ and the lower-bound curve $\Delta LQ_P$ corresponding to the predetermined capacity loss curve $\Delta CQ_P$ can be determined.

Figure 6:
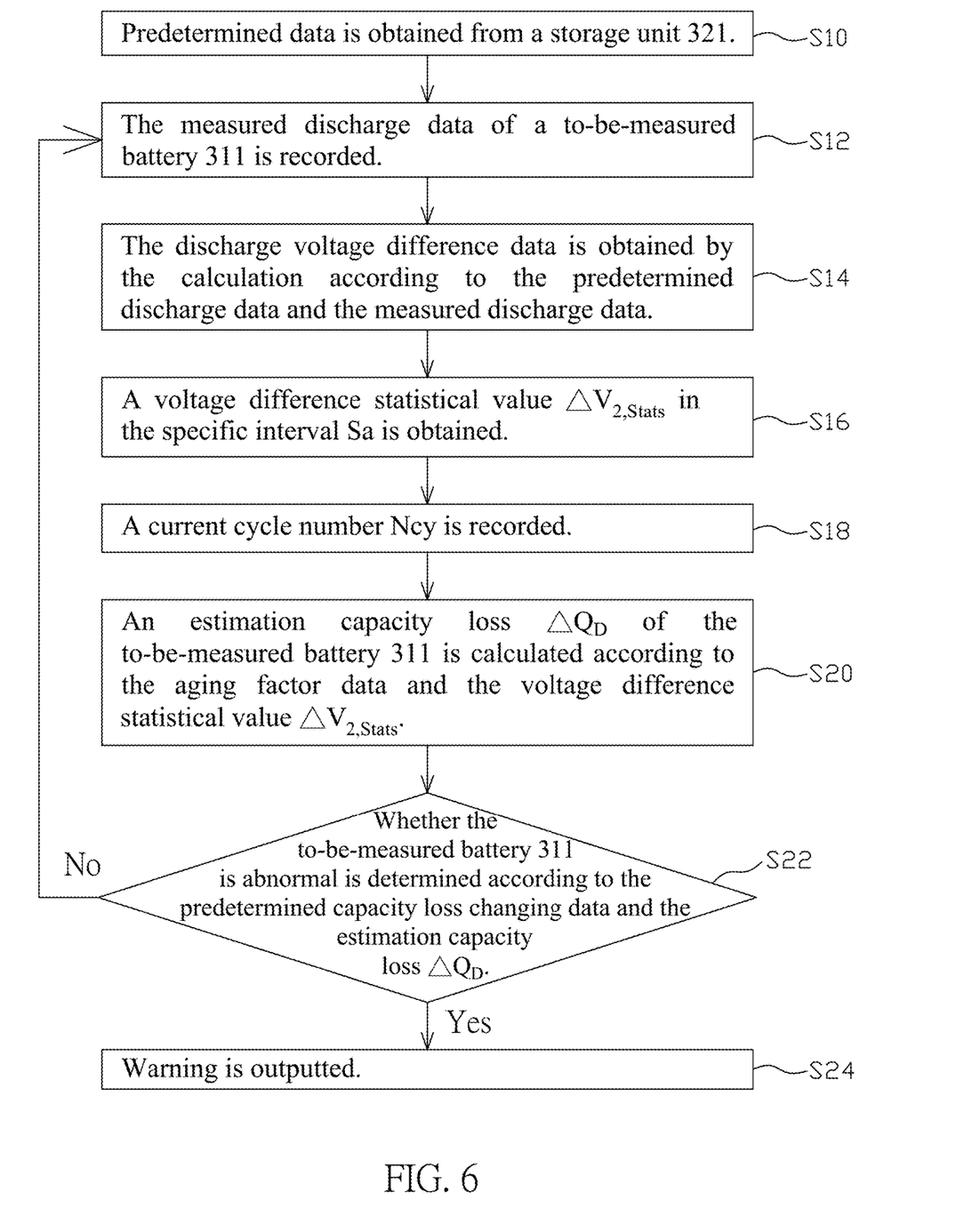
FIG. 6 is a flow chart showing a state estimation method according to another embodiment of this disclosure.

After the above-mentioned procedures have been completed and the information for detecting the abnormal condition has been established, the abnormal detection of the battery can be started, and the detail will be explained in the following. FIG. 6 is a flow chart showing a state estimation method according to another embodiment of this disclosure. Referring to FIG. 6, the state estimation method according to an embodiment of this disclosure includes the following steps.

In a step S11, predetermined data is obtained from a storage unit 321, wherein the predetermined data includes aging factor data, predetermined discharge data, and predetermined capacity loss changing data. The predetermined discharge data is the relationship data of the voltage versus the capacity. The predetermined capacity loss changing data is the relationship data of the cycle number Ncy versus the capacity loss. In one embodiment, the aging factor data includes at least one pre-established aging factor β, the predetermined discharge data includes the discharge curve $V_1$ of the predetermined battery 311 of FIG. 3A, and the predetermined capacity loss changing data includes the predetermined capacity loss curve $\Delta CQ_P$ of FIG. 5. In one embodiment, the predetermined capacity loss changing data preferably further includes a pre-established upper bound curve $\Delta UQ_P$ and a pre-established lower-bound curve $\Delta LQ_P$ corresponding to the predetermined capacity loss curve $\Delta CQ_P$.

In a step S12, the measured discharge data of a to-be-measured battery 311 is recorded. In one embodiment, the discharge curve $V_4$ of the to-be-measured battery 311 is recorded. In the discharge process of the to-be-measured battery 311, the voltage and the capacity are recorded, and the discharge curve $V_4$ of the to-be-measured battery 311 is obtained.

Figure 7:
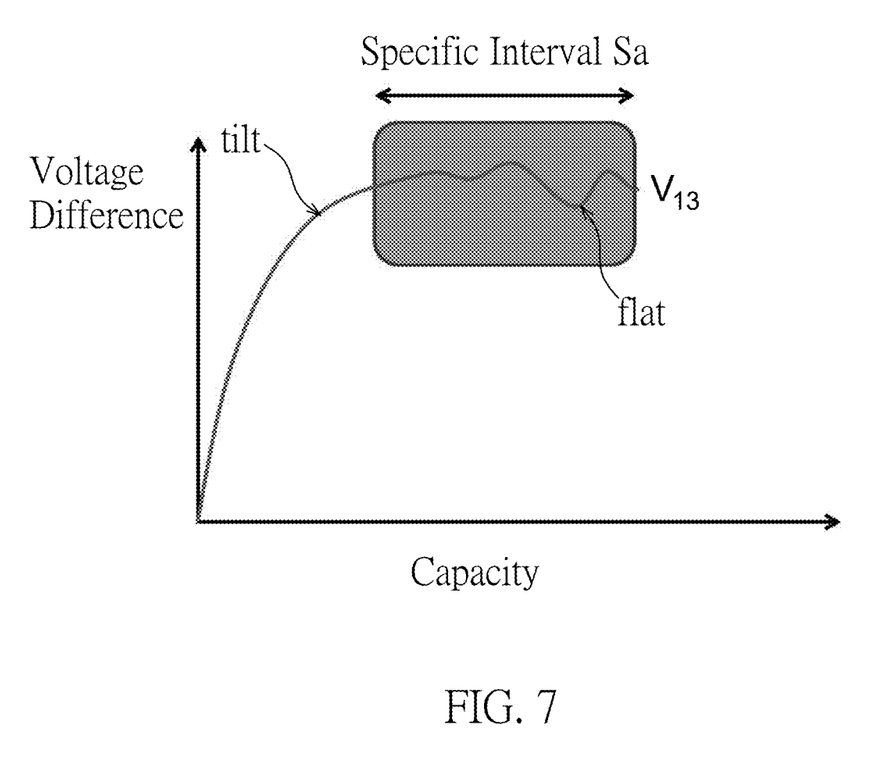
FIG. 7 shows a discharge voltage difference curve of the voltage difference versus the capacity according to another embodiment of this disclosure.

In a step S14, the discharge voltage difference data is obtained by the calculation according to the predetermined discharge data and the measured discharge data. In one embodiment, a discharge voltage difference curve $V_{14}$ is obtained by the calculation according to the discharge curve $V_1$ and the discharge curve $V_4$. FIG. 7 shows a discharge voltage difference curve of the voltage difference versus the capacity according to another embodiment of this disclosure. In one embodiment, as shown in FIG. 7, the voltages of the discharge curves $V_1$ and $V_4$ at the same discharge capacity Q are subtracted from each other to obtain a voltage difference $\Delta V_2$, so that the discharge voltage difference curve $V_{14}$ of the voltage difference versus the capacity is determined according to multiple sets of discharge capacities Q and voltage differences $\Delta V_2$.

In a step S16, a specific interval Sa is determined according to the discharge voltage difference data, and a voltage difference statistical value $\Delta V_{2,Stats}$ in the specific interval Sa is obtained. In one embodiment, a specific interval Sa is determined according to the discharge voltage difference curve $V_{14}$. In one embodiment, the voltage difference statistical value $\Delta V_{2,Stats}$ may be a mean, a median, a mode and the like. Preferably, the voltage difference statistical value $\Delta V_{2,Stats}$ is the mean. In one embodiment, the voltage difference statistical value $\Delta V_{2,Stats}$ is a mean $\Delta V_{2,avg}$ of voltage differences of the discharge voltage difference curve $V_{14}$ in the specific interval Sa.

In a step S18, a current cycle number Ncy is recorded.

In a step S20, an estimation capacity loss $\Delta Q_D$ of the to-be-measured battery 311 is calculated according to the aging factor data and the voltage difference statistical value $\Delta V_{2,Stats}$. In one embodiment, the corresponding aging factor β is multiplied by the voltage difference statistical value $\Delta V_{2,Stats}$ to obtain the estimation capacity loss. That is, the estimation capacity loss $\Delta Q_D = \beta \times \Delta V_{2,Stats}$. In one embodiment, the corresponding aging factor β is multiplied by the voltage difference mean $\Delta V_{2,avg}$ to obtain the estimation capacity loss. That is, the estimation capacity loss $\Delta Q_D = \beta \times \Delta V_{2,avg}$.

In a step S22, whether the to-be-measured battery 311 is abnormal is determined according to the predetermined capacity loss changing data and the estimation capacity loss $\Delta Q_D$. Referring to FIG. 5 in one embodiment, the step S22 judges whether the estimation capacity loss $\Delta Q_D$ falls between an upper bound curve $\Delta UQ_P$ and a lower-bound curve $\Delta LQ_P$ corresponding to the predetermined capacity loss curve $\Delta CQ_P$ to determine whether the to-be-measured battery 311 is abnormal.

In one embodiment, the step S22 includes the following steps.

In a step S42 (not shown), a predetermined capacity loss $\Delta Q_P$ is obtained according to the predetermined capacity loss changing data and the cycle number Ncy. In one embodiment, the predetermined capacity loss $\Delta Q_P$ corresponding to the current cycle number Ncy is found out according to the predetermined capacity loss curve $\Delta CQ_P$ of FIG. 5 and the current cycle number Ncy.

In a step S44 (not shown), the estimation capacity loss $\Delta Q_D$ is compared with the predetermined capacity loss $\Delta Q_P$ to judge whether the to-be-measured battery 311 is abnormal. When the judgement result is affirmative, the process enters the step S26. When the judgement result is negative, the process enters the step S12.

In one embodiment, as shown in FIG. 5, the curve $\Delta CQ_P$ represents the relationship between the cycle numbers Ncy established from the predetermined battery 311, and the predetermined capacity losses $\Delta Q_P$ thereof, and the upper bound curve $\Delta UQ_P$ and the lower-bound curve $\Delta LQ_P$ are determined according to the predetermined capacity loss curve $\Delta CQ_P$. In detecting the capacity loss $\Delta Q_D$ of the current cycle number Ncy, if the detection result falls within the normal region, as shown in the point P1, then it represents that the to-be-measured battery is a normal battery. If the detection result falls outside the normal region, as shown in the point P2, then it represents that the battery is abnormal.

In a step S24, warning is outputted. When the detection result falls outside the normal region, the battery is regarded as abnormal. In this case, a warning signal needs to be outputted. The warning signal may be an audio signal, a LED light signal or a simple data signal for the processing unit 323 to execute a warning program.

In one embodiment, the capacity loss curve $\Delta CQ_P$, the upper bound curve $\Delta UQ_P$ and the lower-bound curve $\Delta LQ_P$ satisfy a function of $\gamma = a \times Ncy^b$, where $\gamma$ denotes the capacity loss $\Delta Q$, Ncy denotes the cycle number, and "a" and "b" are constants. After the constants "a" and "b" of the capacity loss curve $\Delta CQ_P$ have been obtained, the values of the constants "a" and "b" of the upper bound curve $\Delta UQ_P$ and the lower-bound curve $\Delta LQ_P$ are respectively set according to the product specification.

In one embodiment, the capacity loss curve $\Delta CQ_P$ satisfies the function of $\gamma = a \times Ncy^b$, wherein the capacity loss curve $\Delta CQ_P$ plus an upper limit $\gamma_1$ and minus a lower limit $\gamma_2$ leaves the upper bound curve $\Delta UQ_P$ (e.g., $a \times Ncy^b + \gamma_1$) and the lower-bound curve $\Delta LQ_P$ (e.g., $a \times Ncy^b - \gamma_2$). In one embodiment, the upper limit $\gamma_1$ or the lower limit $\gamma_2$ may be a constant; and the upper limit $\gamma_1$ may be the same as or different from the lower limit $\gamma_2$. In one embodiment, the upper limit $\gamma_1$ or the lower limit $\gamma_2$ may be a constant, and $a \times Ncy^b + \gamma_1 \geq 0$ or $a \times Ncy^b - \gamma_2 \geq 0$, where $\gamma_1$ and $\gamma_2$ may be two constants or two variables, or may be one constant and one variable. Preferably, the variable value may be determined by a function.

In one embodiment, $\gamma_1$ may be a function of $\gamma_1 = a_1 \times Ncy^{b1}$, or $\gamma_2$ may be a function of $\gamma_2 = a_2 \times Ncy^{b2}$; and when the constants "$a_1$" and "$a_2$" in these functions are equal to 0, it is judged whether $\Delta Q_D$ falls on the point of $\Delta Q_P$ at the same cycle number Ncy. In one embodiment, it is judged whether $|\Delta Q_D - \Delta Q_P|$ exceeds the upper limit $\gamma_1$ or the lower limit $\gamma_2$ to determine whether the to-be-measured battery 311 is abnormal. It should be noted that the constants "a" and "b" of each curve may change according to the characteristic of the corresponding curve. It should be understood that the above-mentioned embodiments function as examples, and those skilled in the art may arbitrarily combine the calculation methods of the upper limit $\gamma_1$ or the lower limit $\gamma_2$ according to the embodiment.

Figure 8A:
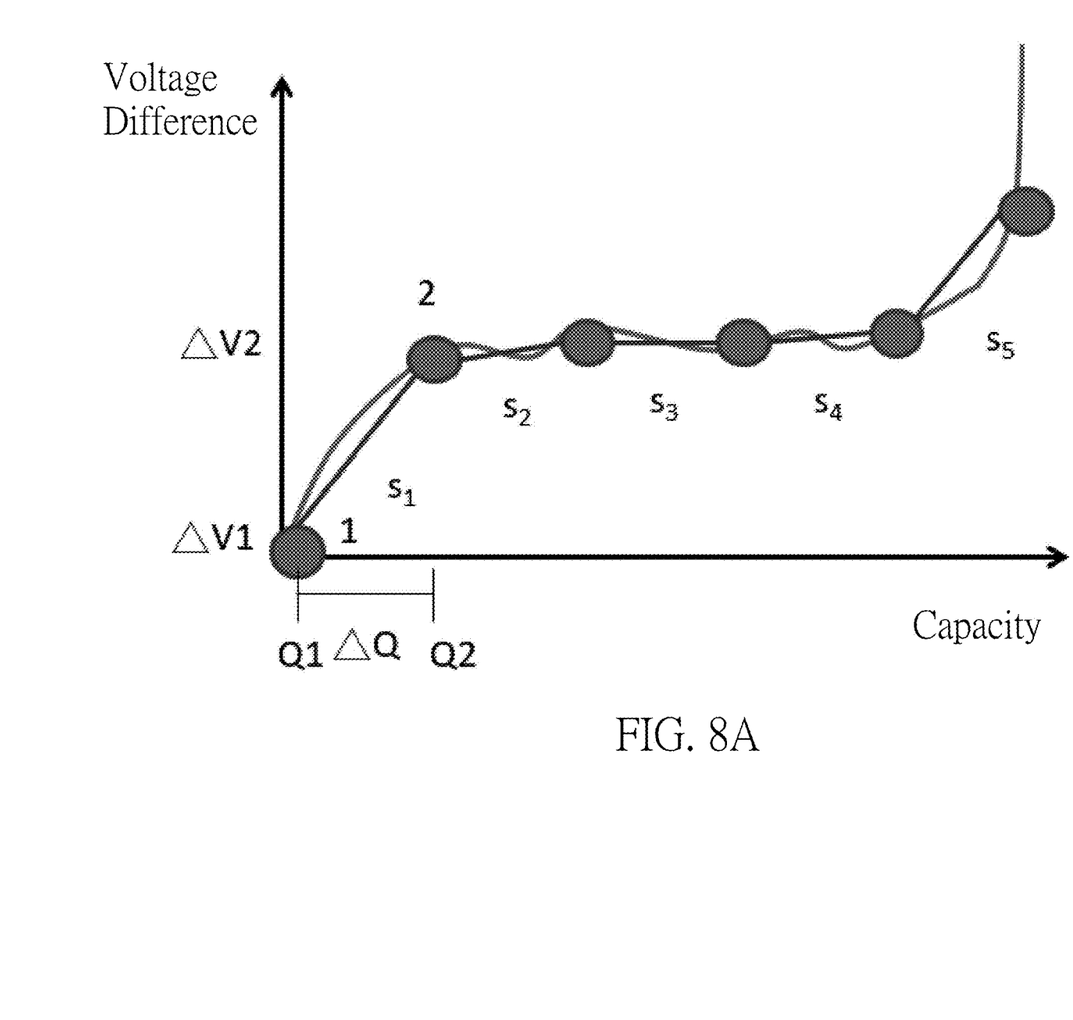
FIG. 8A is a graph for explaining a method of calculating a specific interval according to an embodiment of this disclosure.

The specific interval Sa may be determined by various calculations. Preferably, the discharge voltage difference curve $V_{14}$ includes a tilted region "tilt" and a flat region "flat", wherein the integral slope of the flat region "flat" is smaller than the integral slope of the tilted region "tilt", and the specific interval Sa is set as the flat region "flat". In one embodiment, the integral slope is determined by dividing the discharge voltage difference curve $V_{14}$ into multiple secants, or is composed of the secants. FIG. 8A is a graph for explaining a method of calculating a specific interval according to an embodiment of this disclosure. FIG. 8A provides a slope method for determining the specific interval Sa according to slopes. In one embodiment as shown in FIG. 8A, the discharge voltage difference curve $V_{14}$ is divided into multiple secants per each interval $\Delta Q$, and a secant slope "$s_i$" of each secant is calculated. For example, the secant slope $s_1$ may be represented as $$s_1 = (\Delta V_2 - \Delta V_1)/(Q_2 - Q_1).$$

Figure 8B:
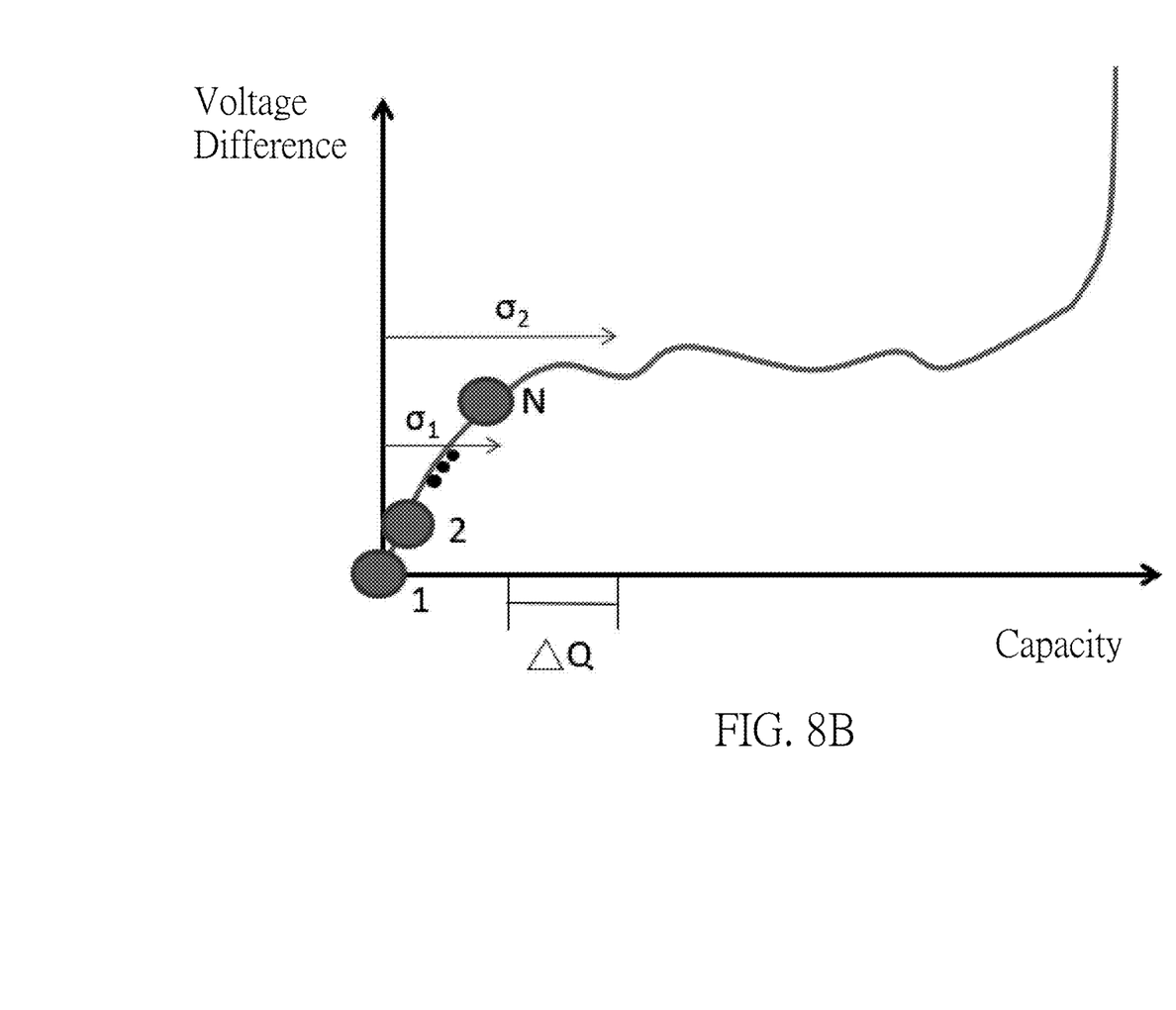
FIG. 8B is a graph for explaining a method of calculating a specific interval according to another embodiment of this disclosure.

When the secant slope "$s_i$" is smaller than (<) a threshold value $TH_1$, it represents the beginning of the flat region. When the secant slope "$s_i$" is greater than (>) a threshold value $TH_2$, it represents the ending of the flat region. In one embodiment, the integral slope is determined by and composed of multiple intervals of the discharge voltage difference curve $V_{14}$. FIG. 8B is a graph for explaining a method of calculating a specific interval according to another embodiment of this disclosure. FIG. 8B provides a variance method for determining the specific interval Sa according to variances. In one embodiment as shown in FIG. 8B, the discharge voltage difference curve $V_{14}$ is divided into multiple intervals per each interval $\Delta Q$, and a variance $\sigma_i$ of each interval is calculated from the position of 0 to the current position. When the variance $\sigma_i$ is smaller than (<) a threshold value $TH_3$, it represents the beginning of the flat region. When the variance $\sigma_i$ is greater than (>) a threshold value $TH_4$, it represents the ending of the flat region. Regarding to the example of the calculation of the variance $\sigma_1$, if N voltage differences are present in the interval, then the variance $\sigma_1$ may be determined by the following Equation (1).

$$\sigma_1 = \sum_{n=1}^{N}(\Delta V_i - \mu)^2 / N, \qquad \text{Equation (1)}$$

where $\mu$ may be determined by the following Equation (2).

$$\mu = \frac{\sum_{n=1}^{N}\Delta V_i}{N}. \qquad \text{Equation (2)}$$

It should be noted that the above-mentioned data may be multiple sets of discrete values, and the curves may be obtained by calculating these discrete numbers using mathematical or statistical algorithms.

In summary, an embodiment of this disclosure provides a state estimation method capable of measuring the discharge voltage difference curve associated with the voltage difference and the capacity, and then determining a specific interval Sa according to the discharge voltage difference curve, and then determining the capacity loss $\Delta Q_{D-}$ of the to-be-measured battery according to the specific interval Sa and the pre-established aging factor $\beta$, and finally judging whether the capacity loss $\Delta Q_{D-}$ becomes abnormal, so that it can be determined that whether the battery has the abnormal condition. Therefore, it is possible to detect the abnormal condition of the battery in the use process of the battery without performing other additional operations, or without the extremely short measurement interval.

What is claimed is:

1. A state estimation method applied to a battery pack, comprising steps of:
   obtaining predetermined data from a storage unit of a control device of the battery pack, wherein the predetermined data comprises aging factor data, predetermined discharge data and predetermined capacity loss changing data;
   recording measured discharge data of a to-be-measured battery of the battery pack in a discharge process of the to-be-measured battery, by use of the control device of the battery pack;
   calculating to obtain discharge voltage difference data according to the predetermined discharge data and the measured discharge data by use of the control device of the battery pack;
   determining a specific interval Sa according to the discharge voltage difference data, and obtaining a voltage difference statistical value $\Delta V_{2,Stats}$ in the specific interval Sa by use of the control device of the battery pack;
   calculating an estimation capacity loss $\Delta Q_D$ of the to-be-measured battery according to the aging factor data and the voltage difference statistical value $\Delta V_{2,Stats}$ by use of the control device of the battery pack; and
   determining whether the to-be-measured battery of the battery pack is abnormal or not according to the predetermined capacity loss changing data and the estimation capacity loss $\Delta Q_D$ by use of the control device of the battery pack,
   wherein
   the predetermined discharge data is a discharge curve $V_1$, and the discharge curve $V_1$ is a voltage-capacity curve;
   the measured discharge data of the to-be-measured battery is a discharge curve $V_4$, and the discharge curve $V_4$ is a voltage-capacity curve;
   the discharge voltage difference data is a discharge voltage difference curve $V_{14}$ determined according to the discharge curve $V_1$ and the discharge curve $V_4$; and
   the voltage difference statistical value $\Delta V_{2,Stats}$ is determined according to a voltage difference between the discharge curve $V_1$ and the discharge curve $V_4$ in the specific interval.

2. The state estimation method according to claim 1, wherein:
   the step of determining the specific interval Sa according to the discharge voltage difference data comprises:
   dividing the discharge voltage difference curve $V_{14}$ into a tilted region and a flat region using a calculation method, and setting the specific interval Sa as the flat region.

3. The state estimation method according to claim 2, wherein the calculation method comprises:
   dividing the discharge voltage difference curve $V_{14}$ into multiple secants comprising a first secant and a second secant, wherein:
   a slope of the first secant smaller than a first threshold value $TH_1$ represents beginning of the flat region, and a slope of the second secant greater than a second threshold value $TH_2$ represents ending of the flat region.

4. The state estimation method according to claim 2, wherein the calculation method comprises:
   dividing the discharge voltage difference curve $V_{14}$ into multiple intervals, and calculating multiple variances of the intervals, wherein:
   the intervals comprise a first interval and a second interval, the variance of the first interval is a first variance, and the variance of the second interval is a second variance;
   the first variance smaller than a first threshold value $TH_3$ represents beginning of the flat region; and
   the second variance greater than a second threshold value $TH_4$ represents ending of the flat region.

5. The state estimation method according to claim 1, wherein:
   the predetermined capacity loss changing data is a predetermined capacity loss curve $\Delta CQ_P$,
   wherein the predetermined data further comprises: an upper bound curve $\Delta UQ_P$ and a lower-bound curve $\Delta LQ_P$ corresponding to the predetermined capacity loss curve $\Delta CQ_P$; and
   the step of determining whether the to-be-measured battery is abnormal or not according to the predetermined capacity loss changing data comprises: judging whether the estimation capacity loss $\Delta Q_D$ falls between the upper bound curve $\Delta UQ_P$ and the lower-bound curve $\Delta LQ_P$ corresponding to the predetermined capacity loss curve $\Delta CQ_P$, wherein:
   the to-be-measured battery is determined as normal aging when the estimation capacity loss $\Delta Q_D$ falls between the upper bound curve $\Delta UQ_P$ and the lower-bound curve $\Delta LQ_P$ corresponding to the predetermined capacity loss curve $\Delta CQ_P$; and
   the to-be-measured battery is determined as abnormal when the estimation capacity loss $\Delta Q_D$ does not fall between the upper bound curve $\Delta UQ_P$ and the lower-bound curve $\Delta LQ_P$ corresponding to the predetermined capacity loss curve $\Delta CQ_P$.

6. The state estimation method according to claim 5, wherein the step of determining whether the to-be-measured battery is abnormal or not according to the predetermined capacity loss changing data further comprises:
   obtaining a current cycle number Ncy, wherein:
   a predetermined capacity loss $\Delta Q_P$ is obtained according to the predetermined capacity loss changing data and the cycle number Ncy; and
   the estimation capacity loss $\Delta Q_D$ and the predetermined capacity loss $\Delta Q_P$ are compared with each other, and it is judged whether the estimation capacity loss $\Delta Q_D$ falls between the upper bound curve $\Delta UQ_P$ and the lower-bound curve $\Delta LQ_P$ corresponding to the predetermined capacity loss curve $\Delta CQ_P$.

7. The state estimation method according to claim 6, wherein:
   the upper bound curve $\Delta UQ_P$ is the predetermined capacity loss curve $\Delta CQ_P$ plus an upper limit $\gamma_1$;
   the lower-bound curve $\Delta LQ_P$ is the predetermined capacity loss curve $\Delta CQ_P$ minus a lower limit $\gamma_2$; and
   the step of comparing the estimation capacity loss $\Delta Q_D$ and the predetermined capacity loss $\Delta Q_P$ with each other comprises: judging whether $|\Delta Q_D - \Delta Q_P|$ exceeds the upper limit $\gamma_1$ or the lower limit $\gamma_2$.

8. The state estimation method according to claim 7, wherein:
   at least one of the upper limit $\gamma_1$ and the lower limit $\gamma_2$ is a constant or a variable value determined by a function.

9. The state estimation method according to claim 6, wherein:
   the aging factor data comprises at least one aging factor $\beta$; and
   the estimation capacity loss $\Delta Q_D = \beta \times \Delta V_{2,Stats}$.

10. The state estimation method according to claim 9, wherein:
- the at least one aging factor $\beta$ is determined according to a predetermined capacity loss $\Delta Q_1$ and a first statistical value $\Delta V_{1,Stats}$, and $\beta = \Delta Q_1/\Delta V_{1,Stats}$;
- the predetermined capacity loss $\Delta Q_1$ is determined according to the discharge curve $V_1$ and a discharge curve $V_2$; and
- the first statistical value $\Delta V_{1,Stats}$ is determined according to a specific interval Sa of a discharge voltage difference curve $V_{12}$ between the discharge curve $V_1$ and the discharge curve $V_2$.

11. The state estimation method according to claim 10, wherein:
- the voltage difference statistical value $\Delta V_{2,Stats}$ is a mean $\Delta V_{2,avg}$ of voltage differences in the specific interval Sa of the discharge voltage difference curve $V_{14}$ obtained from the discharge curve $V_1$ and the discharge curve $V_4$; and
- the first statistical value $\Delta V_{1,Stats}$ is a mean $V_{1,avg}$ of voltage differences in the specific interval Sa of the discharge voltage difference curve $V_{12}$ obtained from the discharge curve $V_1$ and the discharge curve $V_2$.

12. The state estimation method according to claim 1, further comprising: outputting a warning signal when the to-be-measured battery is determined as abnormal.

13. A battery pack, comprising:
- a battery; and
- a control device, which is electrically connected to the battery and executes the state estimation method according to claim 1.

* * * * *